United States Patent
Horiuchi et al.

(10) Patent No.: US 12,077,701 B2
(45) Date of Patent: Sep. 3, 2024

(54) ULTRAVIOLET DETECTION DEVICE COMPRISING A CERAMIC SUBSTRATE AND COMPOSITE OXIDES

(71) Applicant: SHINKO ELECTRIC INDUSTRIES CO., LTD., Nagano (JP)

(72) Inventors: Michio Horiuchi, Nagano (JP); Masaya Tsuno, Matsumoto (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 330 days.

(21) Appl. No.: 17/534,541

(22) Filed: Nov. 24, 2021

(65) Prior Publication Data

US 2022/0165919 A1   May 26, 2022

(30) Foreign Application Priority Data

Nov. 25, 2020 (JP) ................................ 2020-195546

(51) Int. Cl.

| | |
|---|---|
| *C09K 11/77* | (2006.01) |
| *C09K 11/08* | (2006.01) |
| *C09K 11/57* | (2006.01) |
| *H01L 33/50* | (2010.01) |

(52) U.S. Cl.
CPC ...... *C09K 11/7769* (2013.01); *C09K 11/0838* (2013.01); *C09K 11/57* (2013.01); *C09K 11/7768* (2013.01); *C09K 11/7774* (2013.01); *H01L 33/502* (2013.01)

(58) Field of Classification Search
CPC ............ C09K 11/7767; C09K 11/7768; C09K 11/7769; C09K 11/7774; G01J 1/58

USPC ......................................................... 250/372
See application file for complete search history.

(56) References Cited

U.S. PATENT DOCUMENTS

| | | | | |
|---|---|---|---|---|
| 6,121,622 | A * | 9/2000 | Beyne | G01T 1/2935 250/374 |
| 6,362,484 | B1 * | 3/2002 | Beyne | G01T 1/2935 250/374 |
| 6,541,775 | B2 * | 4/2003 | Yagi | G01J 1/429 368/10 |
| 7,368,095 | B2 * | 5/2008 | Munakata | H01M 4/8885 423/594.6 |
| 7,713,466 | B2 * | 5/2010 | Omori | H01G 9/052 419/37 |
| 8,076,653 | B2 * | 12/2011 | Samuel | C09K 11/7769 250/459.1 |
| 8,926,933 | B2 * | 1/2015 | Zhang | C04B 35/62281 977/843 |

(Continued)

FOREIGN PATENT DOCUMENTS

| | | |
|---|---|---|
| JP | 2003-151579 | 5/2003 |
| JP | 2004-349683 | 12/2004 |

(Continued)

*Primary Examiner* — Allen C. Ho
(74) *Attorney, Agent, or Firm* — Rankin, Hill & Clark LLP

(57) ABSTRACT

A composite oxide contains oxides of aluminum, strontium, cerium, lanthanum, and manganese. A light emitting aspect of the composite oxide when the composite oxide is irradiated with a first electromagnetic wave having a wavelength not longer than 300 nm is different from a light emitting aspect of the composite oxide when the composite oxide is irradiated with a second electromagnetic wave having a wavelength longer than 300 nm.

9 Claims, 9 Drawing Sheets

(56) References Cited

U.S. PATENT DOCUMENTS

| | | | |
|---|---|---|---|
| 9,487,697 B2* | 11/2016 | Kinoshita | C09K 11/7774 |
| 11,299,670 B2* | 4/2022 | Pousthomis | C09K 11/595 |
| 11,515,453 B2* | 11/2022 | Heiden | C09K 11/0883 |
| 11,733,162 B2* | 8/2023 | Horiuchi | G01N 21/64 250/372 |
| 2005/0031518 A1 | 2/2005 | Munakata et al. | |
| 2006/0279908 A1 | 12/2006 | Omori et al. | |
| 2008/0170982 A1 | 7/2008 | Zhang et al. | |
| 2015/0147573 A1 | 5/2015 | Zhang et al. | |
| 2015/0308018 A1 | 10/2015 | Zhang et al. | |
| 2016/0083872 A1 | 3/2016 | Zhang et al. | |
| 2016/0251778 A1 | 9/2016 | Zhang et al. | |
| 2016/0273133 A1 | 9/2016 | Zhang et al. | |
| 2016/0312387 A1 | 10/2016 | Zhang et al. | |
| 2017/0001866 A1 | 1/2017 | Zhang et al. | |
| 2017/0096750 A1 | 4/2017 | Zhang et al. | |
| 2017/0137290 A1 | 5/2017 | Zhang et al. | |
| 2017/0327377 A1 | 11/2017 | Zhang et al. | |
| 2019/0002283 A1 | 1/2019 | Zhang et al. | |

FOREIGN PATENT DOCUMENTS

| | | |
|---|---|---|
| JP | 2008-083044 | 4/2008 |
| JP | 2008-523254 | 7/2008 |

\* cited by examiner

FIG.2

| OXIDE | EXAMPLE 1, 2 | COMPARATIVE EXAMPLE 1 | COMPARATIVE EXAMPLE 2 |
|---|---|---|---|
| ALUMINUM OXIDE | ○ | ○ | ○ |
| STRONTIUM CARBONATE | ○ | ○ | ○ |
| CERIUM OXIDE | ○ | ○ | × |
| EUROPIUM OXIDE | × | × | ○ |
| LANTHANUM STRONTIUM MANGANESE OXIDE | ○ | × | × |

FIG.3

| | FIRING METHOD | IRRADIATION WAVELENGTH | |
| --- | --- | --- | --- |
| | | 365nm | 254nm |
| EXAMPLE 1 | ATMOSPHERIC FIRING | NO LIGHT EMISSION | GREENISH WHITE |
| EXAMPLE 2 | REDUCTION FIRING | BLUISH WHITE | GREENISH WHITE |
| COMPARATIVE EXAMPLE 1 | ATMOSPHERIC FIRING | DARK RED | DARK RED |
| | REDUCTION FIRING | BLUISH WHITE | BLUISH WHITE |
| COMPARATIVE EXAMPLE 2 | ATMOSPHERIC FIRING | RED | RED |
| | REDUCTION FIRING | BLUISH WHITE | HARD BLUISH WHITE |

ULTRAVIOLET DETECTION DEVICE COMPRISING A CERAMIC SUBSTRATE AND COMPOSITE OXIDES

This application claims priority from Japanese Patent Application No. 2020-195546, filed on Nov. 25, 2020, the entire contents of which are herein incorporated by reference.

BACKGROUND

Technical Field

The present disclosure relates to a composite oxide and an ultraviolet detection device.

BACKGROUND ART

Background-art methods for detecting ultraviolet light shorter in wavelength than visible light include a method using a film-like label that is discolored when the label is irradiated with ultraviolet light, etc. This label can detect ultraviolet light relatively inexpensively without requiring any power supply. However, the detection of the ultraviolet light by the label is not quantitative and cannot be repeated because the label does not return to its original color once it is discolored.

On the other hand, as ultraviolet detectors, there are various measuring instruments each measuring intensity of an electromagnetic wave including ultraviolet light, for example, using a photomultiplier tube or a photodiode. Although such measuring instruments require, for example, power supplies such as batteries, some of the measuring instruments are highly quantitative, and can measure a shortest wavelength of, for example, about 190 nm.

Recently, attention has been paid to a sterilization effect and a virus inactivation effect of the ultraviolet light, and devices each radiating the ultraviolet light, or the like, are becoming more and more popular. Along with this, it is desired that the ultraviolet light influencing the human body is accurately detected (see e.g., JP-A-2008-083044, JP-A-2008-523254, JP-A-2004-349683, and JP-A-2003-151579).

However, there is no distinction among ultraviolet wavelength ranges in the ultraviolet detection according to the background art. Thus, there is a problem that it is difficult to detect presence/absence of ultraviolet light in a wavelength range where the sterilization effect and the virus inactivation effect are high or in a wavelength range where the effect on the human body is significant.

Specifically, the ultraviolet light generally means an electromagnetic wave with a wavelength not longer than 400 nm. The ultraviolet light includes UV-A with a wavelength in a range of 315 nm to 400 nm, UV-B with a wavelength in a range of 280 nm to 315 nm, and UV-C with a wavelength not longer than 280 nm, etc. The ultraviolet light high in the sterilization effect and the virus inactivation effect is UV-C, and the ultraviolet light significant in the effect on the human body is also UV-C. In other words, for example, as shown in FIG. 9, the ultraviolet light having the sterilization effect is one with a wavelength in a range of 200 nm to 300 nm as indicated by a curve 10, in which the UV-C has the highest sterilization effect. In the same manner or a similar manner, the ultraviolet light influencing the human body is one with a wavelength in a range of 200 nm to 310 nm as indicated a curve 20, in which the UV-C has the greatest effect on the human body.

Thus, even though the UV-C relatively short in wavelength has a significant effect on living organisms and viruses, there is no distinction among the ultraviolet wavelength ranges in the background-art ultraviolet detection. Therefore, presence/absence of irradiation is detected in a state where, for example, the UV-A and the UV-C are confused with each other.

SUMMARY

A certain embodiment provides a composite oxide containing oxides of aluminum, strontium, cerium, lanthanum, and manganese. Alight emitting aspect of the composite oxide when the composite oxide is irradiated with a first electromagnetic wave having a wavelength not longer than 300 nm is different from a light emitting aspect of the composite oxide when the composite oxide is irradiated with a second electromagnetic wave having a wavelength longer than 300 nm.

A certain embodiment provides an ultraviolet detection device comprising: a ceramic substrate; and a composite oxide that is disposed on the ceramic substrate and contains oxides of aluminum, strontium, cerium, lanthanum, and manganese. The composite oxide emits light when the composite oxide is irradiated with a first electromagnetic wave having a wavelength not longer than 300 nm, and does not emit light when the composite oxide is irradiated with a second electromagnetic wave having a wavelength longer than 300 nm.

A certain embodiment provides an ultraviolet detection device comprising:
  a first composite oxide that contains oxides of aluminum, strontium, cerium, lanthanum, and manganese and that emits light only when the first composite oxide is irradiated with an electromagnetic wave having a wavelength not longer than 300 nm;
  a second composite oxide that contains oxides containing aluminum and cerium, and that emits light only when the second composite oxide is irradiated with an electromagnetic wave having a wavelength not longer than 400 nm; and
  a third composite oxide that contains oxides containing aluminum, yttrium, and cerium and that emits light only when the third component oxide is irradiated with an electromagnetic wave having a wavelength not longer than 450 nm.

BRIEF DESCRIPTION OF THE DRAWINGS

FIG. 2 is a table showing materials of sintered bodies according to Examples and Comparative Examples;

FIG. 3 is a table showing colors of lights emitted from the sintered bodies according to the Examples and the Comparative Examples;

DESCRIPTION OF EMBODIMENTS

Embodiments of a composite oxide and an ultraviolet detection device disclosed by the present application will be described below in detail with reference to the drawings. Incidentally, the present invention is not limited by the embodiments.

Embodiment 1

Figure 1:
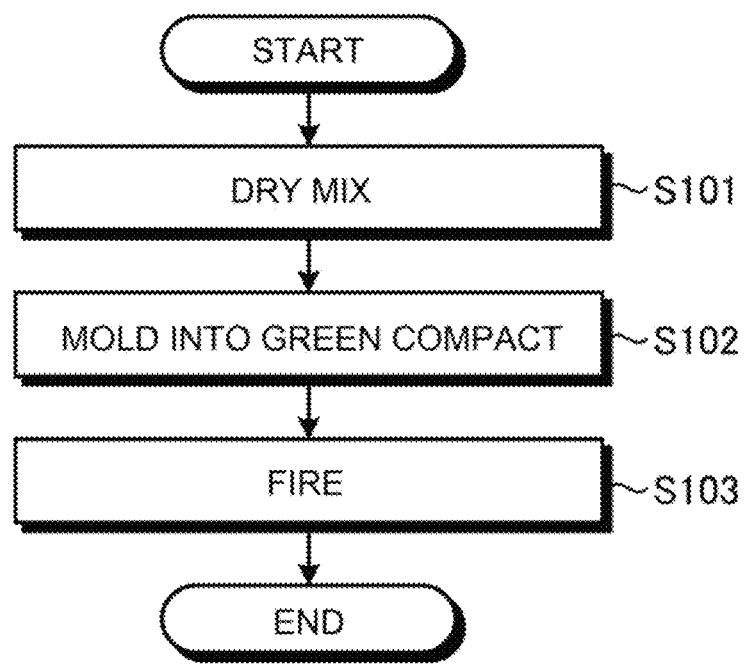
FIG. 1 is a flow chart showing a method for manufacturing a sintered body according to Embodiment 1.

FIG. 1 is a flow chart showing a method for manufacturing a sintered body according to Embodiment 1. The sintered body is a composite oxide in which a plurality of oxides are compounded. The sintered body is not excited even when irradiated with an electromagnetic wave having a wavelength longer than 300 nm. On the other hand, when irradiated with an electromagnetic wave having a wavelength not longer than 300 nm, the sintered body is excited to emit light at a wavelength in a visible light region (generally not shorter than 400 nm). In other words, the sintered body is not excited even when irradiated with UV-A, but is excited to emit light when irradiated with UV-C.

To obtain the sintered body, first, oxides or carbonates of aluminum, strontium, cerium, lanthanum, and manganese are dry-mixed (step S101). That is, for example, aluminum oxide powder, strontium carbonate powder, cerium oxide powder, and lanthanum strontium manganese oxide powder are dry-mixed.

The mixture obtained thus by the dry mixing is then molded into a columnar green compact, for example, by uniaxial pressing (Step S102). The columnar green compact is fired (Step S103). As a result, the sintered body is obtained. A main phase in a crystal phase of the sintered body is $SrA_{12}O_{19}$.

Lights emitted from sintered bodies will be specifically described below according to Examples 1 and 2 that are sintered bodies made of oxides of aluminum, strontium, cerium, lanthanum and manganese, and Comparative Examples 1 and 2 that are sintered bodies made of other oxides.

Example 1

A mixture obtained by dry-mixing 100 parts by weight of aluminum oxide powder, 12 parts by weight of strontium carbonate powder, 2.3 parts by weight of cerium oxide powder and 2.3 parts by weight of lanthanum strontium manganese oxide powder was molded into a columnar green compact with a diameter of about 5 mm by uniaxial pressing. Molar concentrations of the oxide components were 89.4 mole percent of $Al_2O_3$, 7.6 mole percent of $SrO$, 1.2 mole percent of $CeO_2$, 0.8 mole percent of $La_2O_3$, and 1.0 mole percent of $MnO_2$. The columnar green compact was fired in the atmosphere at 1500° C. for 10 hours. As a result, the sintered body according to Example 1 was obtained.

Example 2

A columnar green compact similar to or the same as that according to Example 1 was fired in an $H_2$—$N_2$ reducing atmosphere at 1500° C. for 10 hours. As a result, the sintered body according to Example 2 was obtained.

Comparative Example 1

A mixture obtained by dry-mixing 100 parts by weight of aluminum oxide powder, 12 parts by weight of strontium carbonate powder and 6.9 parts by weight of cerium oxide powder was molded into a plurality of columnar green compacts with a diameter of about 5 mm by uniaxial pressing. Molar concentrations of the oxide components were 89.0 mole percent of $Al_2O_3$, 7.4 mole percent of $SrO$, and 3.6 mole percent of $CeO_2$. A portion of these columnar green compacts were fired in the atmosphere and the remainder thereof were fired in an $H_2$—$N_2$ reducing atmosphere at 1500° C. for 10 hours. As a result, the sintered body according to Comparative Example 1 was obtained.

Comparative Example 2

A mixture obtained by dry-mixing 100 parts by weight of aluminum oxide, 41.2 parts by weight of strontium carbonate and 7.4 parts by weight of europium oxide was molded into a plurality of columnar green compacts with a diameter of about 5 mm by uniaxial pressing. Molar concentrations of the oxide components were 76.6 mole percent of $Al_2O_3$, 21.8 mole percent of $SrO$, and 1.6 mole percent of $Eu_2O_3$. A portion of these columnar green compacts were fired in the atmosphere and the remainder thereof were fired in an $H_2$—$N_2$ reducing atmosphere at 1500° C. for 10 hours. As a result, the sintered body according to Comparative Example 2 was obtained.

The materials of the sintered bodies according to Examples 1 and 2 and Comparative Examples 1 and 2 are shown in FIG. 2. The sintered bodies according to Examples 1 and 2 contained, as materials, the oxides or carbonates of aluminum, strontium, cerium, lanthanum and manganese. In contrast, the sintered body according to Comparative Example 1 did not contain, as a material, lanthanum strontium manganese oxide containing lanthanum and manganese. In addition, the sintered body according to Comparative Example 2 did not contain, as materials, cerium oxide containing cerium and lanthanum strontium manganese oxide containing lanthanum and manganese, but instead contained, as a material, the europium oxide.

These sintered bodies were irradiated with ultraviolet light using a mercury lamp as a light source. The wavelength of the irradiated ultraviolet light was classified into two kinds, i.e. 365 nm belonging to UV-A and 254 nm belonging to UV-C. As a result, the sintered bodies emitted lights in different light emission colors as shown in FIG. 3.

Specifically, almost no light was emitted from the sintered body according to Example 1 when the irradiation wavelength was set to 365 nm, but intense greenish-white light emitted from the same sintered body was confirmed when the irradiation wavelength was set to 254 nm. Bluish-white light emitted from the sintered body according to Example 2 was confirmed when the irradiation wavelength was set to 365 nm, and intense greenish-white light emitted from the same sintered body was confirmed when the irradiation wavelength was set to 254 nm.

As described above, the sintered bodies according to Examples 1 and 2 emitted lights in the respectively different light emitting aspects under the UV-A and UV-C irradiations. In other words, each of the sintered bodies according to Examples 1 and 2 had the light emitting aspects different between the irradiation wavelength not longer than 300 nm and the irradiation wavelength longer than 300 nm, so as to emit light at a different wavelength in the visible light region when irradiated with the UV-C, from a wavelength when irradiated with another type of ultraviolet light. In particular, the atmospherically fired sintered body according to Example 1 emitted light intensely under the UV-C irradiation even though it emitted almost no light under the UV-A irradiation. Therefore, by use of the sintered bodies according to Examples 1 and 2, it is possible to detect the presence/absence of the UV-C irradiation.

In contrast, dark red light emitted from the atmospherically fired sintered body according to Comparative Example 1 was confirmed when the irradiation wavelength was set to 365 nm, and dark red light emitted from the same sintered body was also confirmed even when the irradiation wavelength was set to 254 nm. Moreover, bluish-white light emitted from the reduction-fired sintered body according to Comparative Example 1 was confirmed when the irradiation wavelength was set to 365 nm, and bluish-white light emitted from the same sintered body was also confirmed when the irradiation wavelength was set to 254 nm.

Further, red light emitted from the reduction-fired sintered body according to Comparative Example 2 was confirmed when the irradiation wavelength was set to 365 nm, and red light emitted from the same sintered body was also confirmed even when the irradiation wavelength was set to 254 nm. Moreover, bluish-white light emitted from the reduction-fired sintered body according to Comparative Example 2 was confirmed when the irradiation wavelength was set to 365 nm, and dark bluish-white light emitted from the same sintered body was confirmed when the irradiation wavelength was set to 254 nm.

Thus, the sintered bodies according to Comparative Examples 1 and 2 exhibited the same or similar light emission colors under the UV-A and UV-C irradiations, and did not emit lights to distinguish the wavelengths of the irradiated ultraviolet lights from each other.

Figure 4A:
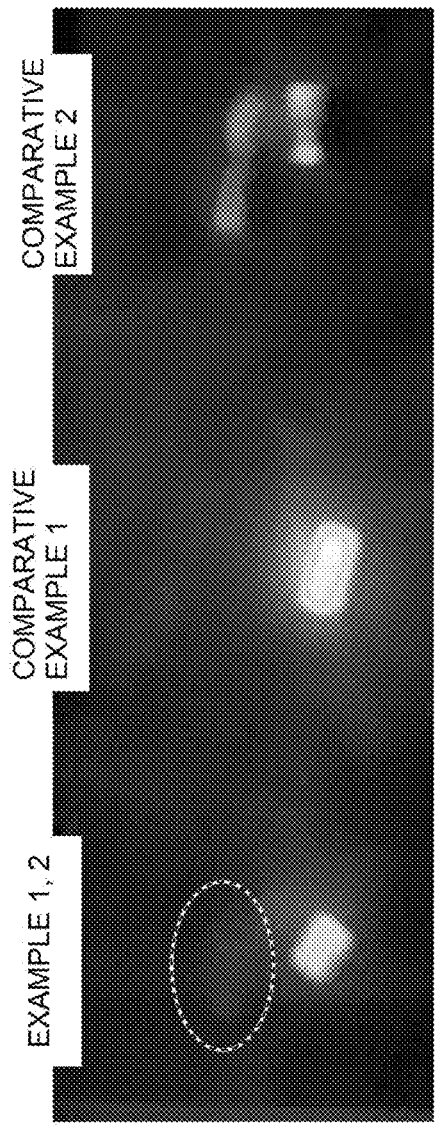
FIGS. 4A and 4B are views showing specific examples of the lights emitted from the sintered bodies according to the Examples and the Comparative Examples.
Figure 4B:

FIGS. 4A and 4B show specific examples of the lights emitted from the sintered bodies according to Examples 1 and 2 and the sintered bodies according to Comparative Examples 1 and 2. FIG. 4A shows the lights emitted from the sintered bodies when the sintered bodies were irradiated with the UV-A with the wavelength of 365 nm, and FIG. 4B shows the lights emitted from the sintered bodies when the sintered bodies were irradiated with the UV-C with the wavelength of 254 nm. In FIGS. 4A and 4B, an upper half part shows the emitted light states of the respective atmospherically fired sintered bodies and a lower half part shows the emitted light states of the respective reduction-fired sintered bodies.

As shown in FIGS. 4A and 4B, the atmospherically fired sintered body according to Example 1 did not emit light under the UV-A irradiation (FIG. 4A), but emitted light intensely under the UV-C irradiation (FIG. 4B). In addition, the reduction-fired sintered body according to Example 2 emitted light more intensely under the UV-C irradiation (FIG. 4B) than under the UV-A irradiation (FIG. 4A). Therefore, according to each of these sintered bodies, it is possible to specifically confirm the presence/absence of the UV-C irradiation according to the emission of light at a wavelength in the visible light region. On the other hand, intensity of the light emitted from the sintered body according to each of Comparative Examples 1 and 2 under the UV-A irradiation (FIG. 4A) was similar to intensity of the light emitted from the same sintered body under the UV-C irradiation (FIG. 4B) regardless of the firing methods (i.e. the atmospheric firing and the reduction firing). Therefore, it is difficult to specifically confirm the presence/absence of the UV-C irradiation. Incidentally, the term "light emitted from the sintered body" here means the light emitted from the sintered body in the visible light wavelength band. Similarly, the term "no light emitted from the sintered body" means that the sintered body does not emit light in the visible light wavelength band. In other words, when the sintered body emits light, the light emitted from the sintered body can be confirmed by the human eye. On the other hand, when the sintered body does not emit light, the human eye cannot confirm the light emitted from the sintered body.

According to the present embodiment, as described above, it is possible to obtain the sintered body that is made of the composite oxide containing, as the materials, the oxides or carbonates of aluminum, strontium, cerium, lanthanum, and manganese, and that emits light in a different light emission mode (e.g. light emission intensity or light emission color) when irradiated with the ultraviolet light having the wavelength not longer than 300 nm, from that when irradiated with the ultraviolet light having the wavelength longer than 300 nm. In particular, the intensity of light emitted from the sintered body when the sintered body is irradiated with the ultraviolet light having the wavelength not longer than 300 nm and the intensity of light emitted from the sintered body when the sintered body is irradiated with the ultraviolet light having wavelength longer than 300 nm are different from each other. Therefore, the presence/absence of the irradiation of the UV-C, which has a significant effect on living organisms and viruses, can be visually confirmed according to the emission of the light with the wavelength in the visible light region, and the wavelength range of the ultraviolet light can be distinguished and detected. Thus, it is possible to intuitively grasp whether the sintered body is irradiated with UV-C or not by looking at the light emission mode of the sintered body.

Incidentally, the molar concentrations of the oxide components of the composite oxide shown in each of Examples 1 and 2 of Embodiment 1 are simply exemplified. The molar concentrations of the oxide components can be changed suitably as follows. That is, for example, the molar concentration of the aluminum oxide may be changed in a range of 84.9 mole percent to 93.8 mole percent, the molar concentration of the strontium oxide may be changed in the range of 7.2 mole percent to 8.0 mole percent, the molar concentration of the cerium oxide may be changed in the range of 1.1 mole percent to 1.3 mole percent, the molar concentration of the lanthanum oxide may be changed in the range of 0.8 mole percent to 0.9 mole percent, and the molar concentration of the manganese oxide may be changed in a range of 1.0 mole percent to 1.1 mole percent.

Embodiment 2

In Embodiment 1, the sintered body obtained by firing the mixture of the oxides of aluminum, strontium, cerium, lanthanum, and manganese is used to detect UV-C. However, it is also possible to form the composite oxide into the shape of a paste and print the paste of the composite oxide on ordinary ceramic or the like. Therefore, Embodiment 2 will be described in a case where a sintered body in which a composite oxide has been printed is used to detect UV-C.

Figure 5:
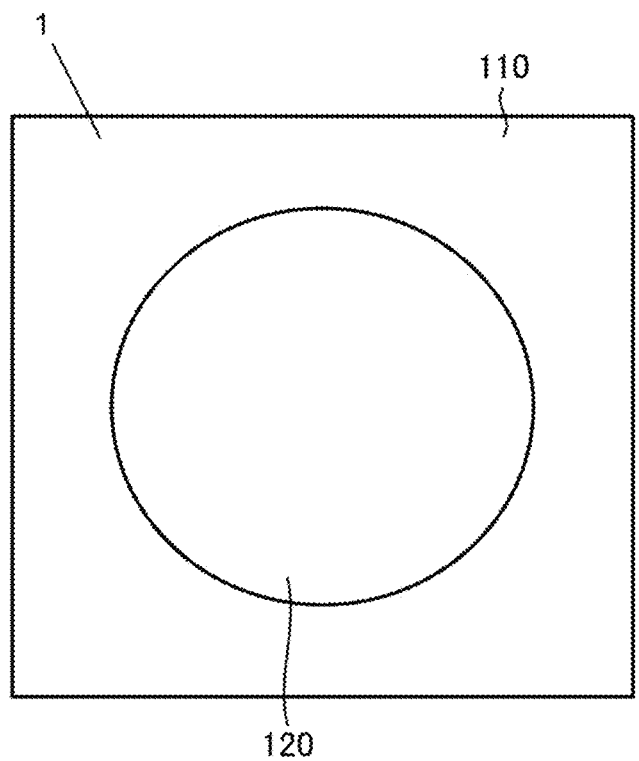
FIG. 5 is a plan view showing a specific example of an ultraviolet detection device according to Embodiment 2.

FIG. 5 is a plan view showing a specific example of an ultraviolet detection device 1 according to Embodiment 2. As shown in FIG. 5, the ultraviolet detection device 1 has a configuration in which a composite oxide 120 containing aluminum, strontium, cerium, lanthanum, and manganese has been printed on a surface of a ceramic substrate 110.

The ceramic substrate 110 is a ceramic substrate, for example, obtained by firing a green sheet having aluminum oxide as a main component. It is desirable that the ceramic substrate 110 is made of aluminum oxide ceramic having purity as high as possible.

The composite oxide 120 has, for example, aluminum oxide as a main component like the ceramic substrate 110, and contains strontium carbonate, cerium oxide, and lanthanum strontium manganese oxide as components in addition to the aluminum oxide. The composite oxide 120 is generally excited by an electromagnetic wave having a wavelength not longer than 300 nm to, for example, intensely emit greenish-white light under ultraviolet light irradiation having a UV-C or shorter wavelength.

A method for manufacturing the ultraviolet detection device 1 shown in FIG. 5 includes a first method in which a paste of the composite oxide 120 is printed on the green sheet, which is the material of the ceramic substrate 110, and then fired, and a second method in which a paste of the composite oxide 120 is printed on the ceramic substrate 110 obtained after firing, and then fired again.

Specifically, in the first method, 100 parts by weight of aluminum oxide powder, 12 parts by weight of strontium carbonate powder, 2.3 parts by weight of cerium oxide powder and 2.3 parts by weight of lanthanum strontium manganese oxide powder are dry-mixed, and a pasting vehicle is added and mixed thereto. As a result, a paste of the composite oxide 120 is obtained. This paste is printed, for example, in a pad shape with a diameter of about 15 mm on a green sheet of an inorganic composition, and dried. The green sheet of the inorganic composition has 99.9% or more by weight of aluminum oxide. Then, the green sheet on which the paste has been printed is fired in the atmosphere at 1500° C. for 10 hours. As a result, an ultraviolet detection device 1 shown in FIG. 5 is obtained.

In addition, in the second method, a paste of the composite oxide 120 is obtained in the same manner as that in the first method. Then, the paste is printed, for example, in a pad shape with a diameter of about 15 mm on a ceramic substrate 110 and dried. The ceramic substrate 110 is obtained by firing a green sheet of an inorganic composition that has 99.9% or more by weight of aluminum oxide. Then, the ceramic substrate 110 on which the paste has been printed is fired in the atmosphere at 1500° C. for 10 hours. As a result, another ultraviolet detection device 1 shown in FIG. 5 is obtained.

Figure 6A:
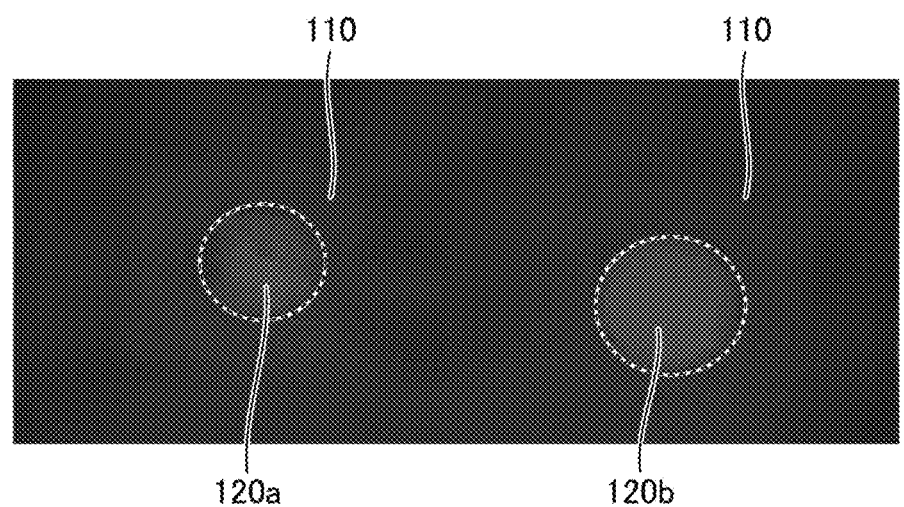
FIGS. 6A and 6B are views showing specific examples of lights emitted from composite oxides according to Embodiment 2.
Figure 6B:
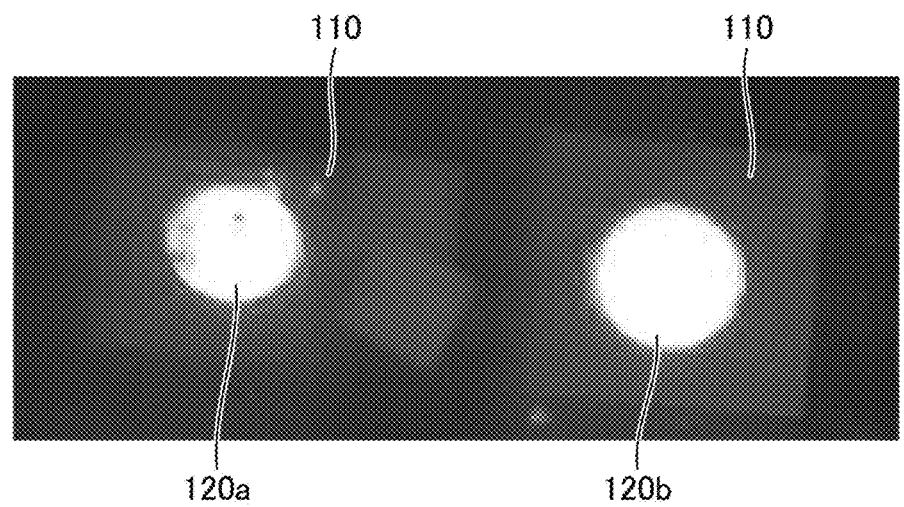

The ultraviolet detection device 1 obtained thus is irradiated with ultraviolet light using a mercury lamp as a light source. The wavelength of the irradiated ultraviolet light has two kinds, i.e. 365 nm, which belongs to UV-A, and 254 nm, which belongs to UV-C. As a result, as shown in FIGS. 6A and 6B, the composite oxide 120a of the ultraviolet detection device obtained by the first method and the composite oxide 120b of the ultraviolet detection device obtained by the second method emit lights in different light emission modes under the UV-A and UV-C irradiations. FIG. 6A shows lights emitted from the composite oxides 120a and 120b when the composite oxides 120a and 120b are irradiated with the UV-A having the wavelength of 365 nm, and FIG. 6B shows lights emitted from the composite oxides 120a and 120b when the composite oxides 120a and 120b are irradiated with the UV-C having the wavelength of 254 nm.

As shown in FIGS. 6A and 6B, the composite oxide 120a of the ultraviolet detection device obtained by the first method does not emit light under the UV-A irradiation (FIG. 6 A), but intensely emits light under the UV-C irradiation (FIG. 6 B). Moreover, the composite oxide 120b of the ultraviolet detection device obtained by the second method also does not emit light under the UV-A irradiation (FIG. 6 A), but intensely emits light under the UV-C irradiation (FIG. 6 B). Incidentally, it is a matter of course that the ceramic substrate 110 does not emit light under the UV-A irradiation and the UV-C irradiation. Thus, according to each of these ultraviolet detection devices, it is possible to specifically confirm the presence/absence of the UV-C irradiation by the light emitted at a wavelength in the visible light region from the composite oxide 120.

According to the present embodiment, as described above, the ultraviolet detection device in which the paste of the composite oxide made of the oxides or carbonates of aluminum, strontium, cerium, lanthanum and manganese is printed on the ceramic substrate is obtained. When irradiated with the ultraviolet light having the wavelength not longer than 300 nm, the portion where the composite oxide is printed emits light in a different light emitting aspect from that when irradiated with the ultraviolet light having the wavelength longer than 300 nm. Therefore, the presence/absence of the irradiation of the UV-C, which has a significant effect on living organisms and viruses, can be visually confirmed by emission of the light having the wavelength in the visible light region, so that the wavelength range of the ultraviolet light can be distinguished and detected.

Embodiment 3

In Embodiment 2, the paste of the composite oxide containing aluminum, strontium, cerium, lanthanum and manganese as the components is printed on the ceramic substrate to detect the presence/absence of the UV-C irradiation. Embodiment 3 will be described in a case where pastes of other composite oxides are further printed on the ceramic substrate so as to detect presence/absence of irradiation of visible light and UV-A.

Figure 7:
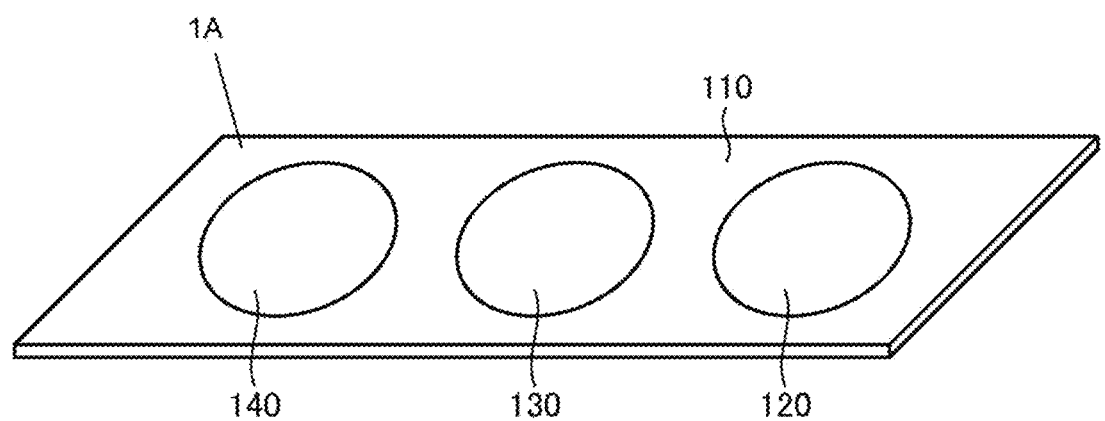
FIG. 7 is a view showing a configuration of an ultraviolet detection device according to Embodiment 3.

FIG. 7 is a view showing the configuration of an ultraviolet detection device 1A according to Embodiment 3. In FIG. 7, the same portions as those in FIG. 5 will be designated by the same reference signs respectively and correspondingly. As shown in FIG. 7, the ultraviolet detection device 1A has a configuration in which composite oxides 120, 130, and 140 are printed on a surface of a ceramic substrate 110.

The ceramic substrate 110 is a ceramic substrate, that is, for example, obtained by firing a green sheet having aluminum oxide as a main component. It is desirable that the ceramic substrate 110 is made of aluminum oxide ceramic having purity as high as possible.

The composite oxide 120 has, for example, aluminum oxide as a main component, like the ceramic substrate 110, and contains strontium carbonate, cerium oxide, and lanthanum strontium manganese oxide as components in addition to the aluminum oxide. The composite oxide 120 is generally excited by an electromagnetic wave having a wavelength not longer than 300 nm to, for example, intensely emit greenish-white light under ultraviolet light irradiation with a UV-C or shorter wavelength.

The composite oxide 130 has, for example, aluminum oxide as a main component, like the ceramic substrate 110, and contains cerium oxide as a component in addition to the aluminum oxide. The composite oxide 130 is generally excited by an electromagnetic wave having a wavelength not longer than 400 nm to, for example, emit bluish-white light under ultraviolet light irradiation having a UV-A or shorter wavelength.

The composite oxide 140 has, for example, aluminum oxide as a main component, like the ceramic substrate 110, and contains yttrium oxide and cerium oxide as components in addition to the aluminum oxide. The composite oxide 140 is generally excited by an electromagnetic wave having a wavelength not longer than 450 nm to, for example, emit yellow light under visible light irradiation and ultraviolet light irradiation having a UV-A or shorter wavelength.

Next, detection of the ultraviolet light by the ultraviolet detection device 1A having the above configuration will be described with reference to FIGS. 8A to 8D.

Figure 8A:
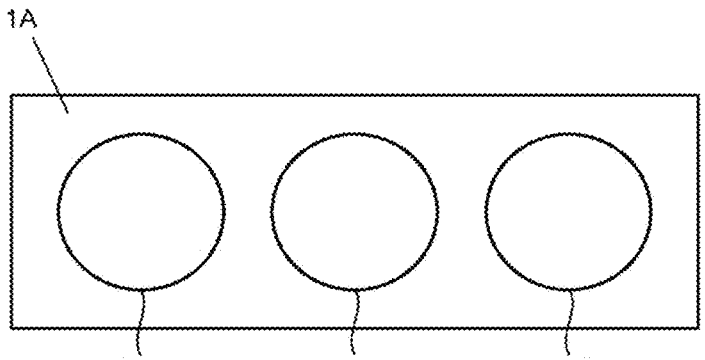
FIGS. 8A to 8D are views showing specific examples of ultraviolet detection.

The composite oxides 120, 130, and 140 that can be excited by electromagnetic waves having different wavelengths to emit lights are printed in the ultraviolet detection device 1A. When, for example, none of the composite oxides 120, 130, and 140 emits light, as shown in FIG. 8A, it is possible to determine that the ultraviolet detection device 1A is not irradiated with visible light having a wavelength shorter than 450 nm and ultraviolet light.

Figure 8B:
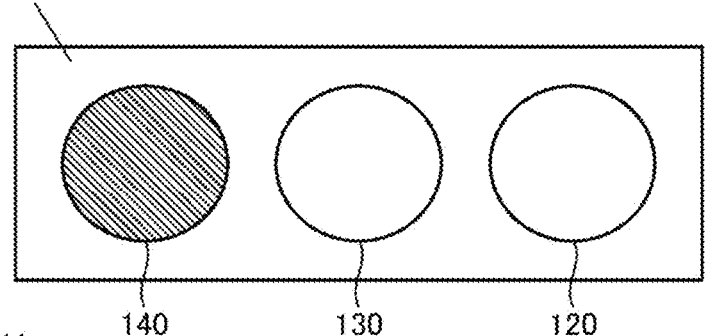

In addition, when, for example, only the composite oxide 140 emits light but the composite oxides 120 and 130 do not emit light, as shown in FIG. 8B, it is possible to determine that the ultraviolet detection device 1A is irradiated with the visible light having the wavelength shorter than 450 nm but the ultraviolet detection device 1A is not irradiated with ultraviolet light having a UV-A or shorter wavelength.

Figure 8C:
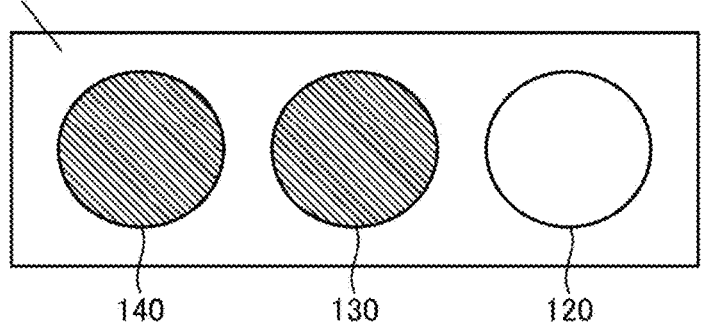

Moreover, when, for example, the composite oxides 130 and 140 emit light but only the composite oxide 120 does not emit light, as shown in FIG. 8C, it is possible to determine that the ultraviolet detection device 1A is irradiated with the UV-A but the ultraviolet detection device 1A is not irradiated with ultraviolet light having a UV-C or shorter wavelength.

Figure 8D:
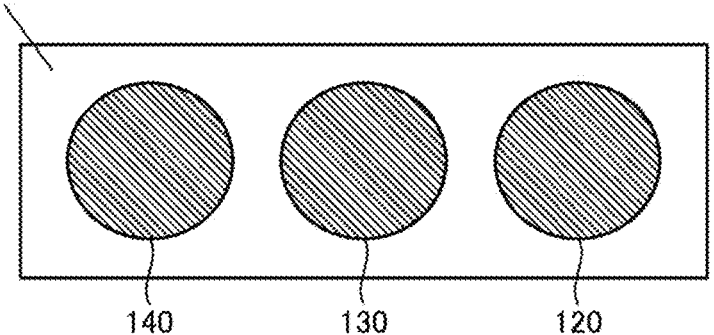
Figure 9:
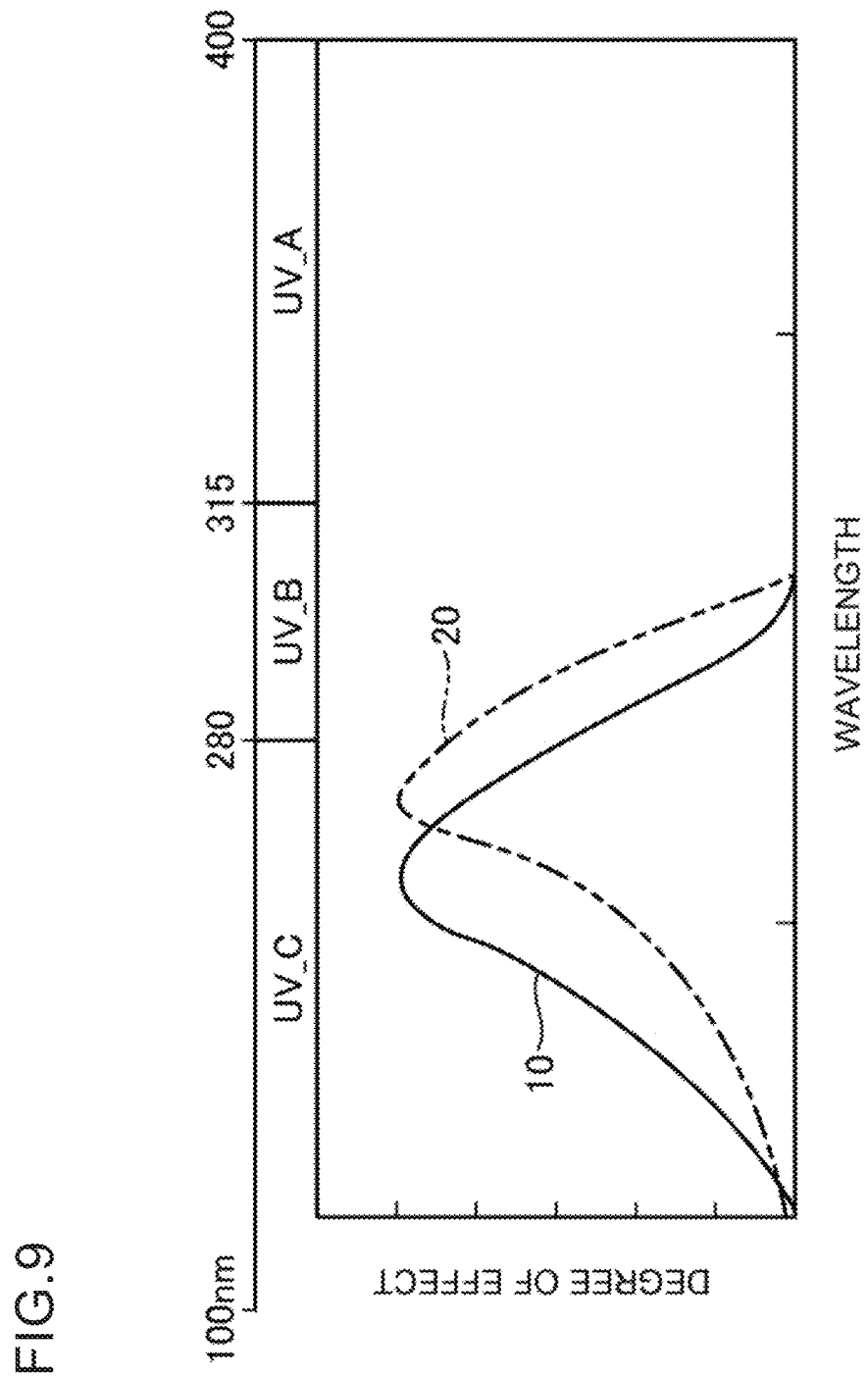
FIG. 9 is a graph showing the degree of an effect of ultraviolet radiation on living organisms.

Moreover, when, for example, all of the composite oxides 120, 130, and 140 emit light, as shown in FIG. 8D, it is possible to determine that the ultraviolet detection device 1A is irradiated with the ultraviolet light having the UV-C or shorter wavelength.

Thus, the ultraviolet detection device 1A can distinguish the visible light, the UV-A and the UV-C from one another and detect presence/absence of their irradiations based on the light emission states of the three composite oxides 120, 130, and 140.

According to the present embodiment, as described above, the ultraviolet detection device is configured by printing the composite oxides on the ceramic substrate. The composite oxides have different excitation wavelengths respectively. Each of the composite oxides is made of the oxides or carbonates of aluminum, strontium, cerium, lanthanum and manganese. The composite oxides emit lights respectively in accordance with the wavelength of the electromagnetic wave radiated on the ultraviolet detection device. Therefore, the presence/absence of the irradiation with the ultraviolet light including the UV-C, that has a significant effect on living organisms and viruses, can be visually confirmed based on the emission of the light having the wavelength in the visible light region, so that the wavelength range of the ultraviolet light can be distinguished and detected.

Incidentally, in Embodiment 3, the ultraviolet detection device is configured by printing the pastes of the composite oxides 120, 130, and 140 on the ceramic substrate 110. However, the ultraviolet detection device may be alternatively configured such that the composite oxides 120, 130, and 140 are fired to form sintered bodies, and the sintered bodies are, for example, adhesively bonded to the ceramic substrate 110 with a resin.

Although the preferred embodiments etc. have been described in detail, the concept of the disclosure is not limited to the above-described embodiments etc. and various modifications and replacements can be made in the above-described embodiments etc. without departing from the scope of the claims.

What is claimed is:

1. A composite oxide comprising:
   a body formed of oxides of aluminum, strontium, cerium, lanthanum, and manganese,
   wherein a light emitting aspect of the body when the body is irradiated with a first electromagnetic wave having a wavelength not longer than 300 nm is different from a light emitting aspect of the body when the body is irradiated with a second electromagnetic wave having a wavelength longer than 300 nm,
   wherein the body is one of a sintered body or a paste.

2. The composite oxide according to claim 1, wherein $SrAl_{12}O_{19}$ serves as a main phase in a crystal phase of the body.

3. The composite oxide according to claim 1, wherein the body emits light when the body is irradiated with the first electromagnetic wave, and the body does not emit light when the body is irradiated with the second electromagnetic wave.

4. The composite oxide according to claim 1, wherein a wavelength of light emitted from the body when the body is irradiated with the first electromagnetic wave is different from a wavelength of light emitted from the body when the body is irradiated with the second electromagnetic wave.

5. The composite oxide according to claim 1, wherein an intensity of light emitted from the body when the body is irradiated with the first electromagnetic wave is different from an intensity of light emitted from the body when the body is irradiated with the second electromagnetic wave.

6. An ultraviolet detection device comprising:
   a ceramic substrate; and
   a composite oxide that is disposed on the ceramic substrate and contains oxides of aluminum, strontium, cerium, lanthanum, and manganese,
   wherein the composite oxide emits light when the composite oxide is irradiated with a first electromagnetic wave having a wavelength not longer than 300 nm, and does not emit light when the composite oxide is irradiated with a second electromagnetic wave having a wavelength longer than 300 nm.

7. The ultraviolet detection device according to claim 6, further comprising:
   a second composite oxide that is disposed on the ceramic substrate and the second composite oxide emits light when the second composite oxide is irradiated with the second electromagnetic wave or the first electromagnetic wave.

8. The ultraviolet detection device according to claim 7, wherein
   the second composite oxide contains oxides containing aluminum and cerium, or oxides containing aluminum, yttrium, and cerium.

9. An ultraviolet detection device comprising:
   a first composite oxide that contains oxides of aluminum, strontium, cerium, lanthanum, and manganese, and that the first composite oxide emits light only when the first composite oxide is irradiated with an electromagnetic wave having a wavelength not longer than 300 nm;

a second composite oxide that contains oxides containing aluminum and cerium, and the second composite oxide emits light only when the second composite oxide is irradiated with an electromagnetic wave having a wavelength not longer than 400 nm; and
a third composite oxide that contains oxides containing aluminum, yttrium, and cerium, and the third composite oxide emits light only when the third component oxide is irradiated with an electromagnetic wave having a wavelength not longer than 450 nm.

* * * * *